United States Patent [19]

Chapman

[11] Patent Number: 5,151,780
[45] Date of Patent: Sep. 29, 1992

[54] DIFFERENTIAL AMPLIFIERS

[75] Inventor: David M. Chapman, Southampton, England

[73] Assignee: U.S. Philips Corporation, New York, N.Y.

[21] Appl. No.: 491,136

[22] Filed: Mar. 9, 1999

[30] Foreign Application Priority Data

Mar. 10, 1989 [GB] United Kingdom ............ 8905525

[51] Int. Cl.⁵ ........................................... H04N 9/64
[52] U.S. Cl. .................................. 358/21 R; 358/30; 358/16
[58] Field of Search ............ 307/296.4, 362, 355, 307/491, 255; 358/22 C, 30, 16, 21

[56] References Cited

U.S. PATENT DOCUMENTS

| | | | |
|---|---|---|---|
| 3,073,969 | 6/1963 | Skiller | 307/255 |
| 3,316,358 | 4/1967 | Guisinger | 307/255 |
| 3,588,827 | 6/1971 | Van Roessel et al. | 358/30 |
| 3,624,417 | 11/1971 | Dao | 307/255 |
| 3,743,863 | 7/1973 | Hilbert et al. | 307/255 |
| 4,256,980 | 3/1981 | Asada et al. | 307/254 |
| 4,262,218 | 4/1981 | Ishii | 307/255 |
| 4,367,419 | 1/1983 | Yazawa et al. | 307/254 |
| 4,410,858 | 10/1983 | Kusakabe | 307/255 |
| 4,414,574 | 11/1983 | Verlinden | 358/184 |
| 4,475,161 | 10/1984 | Stock | 358/16 |
| 4,572,967 | 2/1986 | Metz | 307/243 |
| 4,701,638 | 10/1987 | Marchio et al. | 307/255 |

FOREIGN PATENT DOCUMENTS 53-138266 2/1978 Japan .
59-64923 4/1984 Japan .

Primary Examiner—John K. Peng
Assistant Examiner—Minsun Oh
Attorney, Agent, or Firm—Edward W. Goodman

[57] ABSTRACT

A differential amplifier includes two transistors T1 and T2 having their collectors connected through respective loads R1 and R2 to one supply line VL1, their emitters connected together and to a controllable constant current source IB which supplies a bias current Ib and which is connected between the common connection of the emitters and a return supply line VL2. The transistor bases are connected to receive a control voltage Vc. The common connection of the emitters is also connected through a by-pass resistance RB to a bias voltage source +VB. The circuit parameters are such that flow of bias current Ib will result in a small current Ir being diverted through the by-pass resistance RB instead of flowing through the transistors. This small current approximates in value to the value of any residual bias current when the curent source IB is switched off, but has a value which is negligible relative to the value of the bias current when the current source IB is switched on.

3 Claims, 2 Drawing Sheets

1

DIFFERENTIAL AMPLIFIERS

BACKGROUND OF THE INVENTION

Field of the Invention

Description of the Related Art

The differential amplifier is a well-known circuit configuration which is used to amplify the voltage difference between two input signals.

FIG. 1 of the accompanying drawings shows a basic circuit of a differential amplifier. This basic circuit comprises two transistors T1 and T2, the collectors of which are connected via respective load resistances R1 and R2 to a positive supply line VL1. The emitters of these two transistors T1 and T2 are connected together and to a constant current source IB, which can supply a bias current Ib. The current source IB is connected between the common transistor emitter connection and a negative supply line VL2. Two voltage supplies V1 and V2 provide a supply voltage across the supply lines VL1 and VL2. The base of the transistor T2 is connected to a reference point (ground), and the base of the transistor T1 is connected to a control voltage source VC which supplies a variable control voltage Vc.

In this basic differential amplifier circuit, the control voltage Vc determines the value of the transistor collector currents Ic1 and Ic2 which together substantially equal the bias current Ib. For non-zero values of the bias current Ib, the values of the currents Ic1 and Ic2 can be controlled by variation of the control voltage Vc. Given equal transistor parameters, one of these collector currents will increase, and the other will have an identical decrease, in response to a change in the control voltage Vc. Either of the collector currents Ic1 and Ic2 can be used as an output current from the differential amplifier, or the collector voltage of either of the transistors T1 and T2, as developed across load resistances R1 and R2, respectively, can be taken as an output voltage from the differential amplifier. The differential amplifier can therefore be regarded as 'ON' when a finite value of the bias current Ib exists. If the bias current Ib is made zero, then there can be no collector currents Ic1 and Ic2, irrespective of the value of the control voltage Vc, and the differential amplifier can be regarded as 'OFF'.

Using an active circuit element as the constant current source IB makes it possible to switch the source 'on' and 'off' so as to provide a controllable switching of the differential amplifier between its 'ON' and 'OFF' conditions. However, leakage current through, or poor 'on/off' control of, the constant current source may result in a small residual bias current Ib when it is intended that it should be zero. Thus, in this circumstance, when the differential amplifier is intended to be 'OFF', suppression of the control of the output current (or voltage) by the control voltage Vc will be poor.

SUMMARY OF THE INVENTION

It is an object of the present invention to provide a differential amplifier in which this suppression is improved.

According to the invention, a differential amplifier comprising two transistors having their collectors connected through respective loads to one supply line, their emitters connected together and to a controllable constant current source which supplies a bias current and which is connected between the common connection of the emitters and a return supply line, and their bases connected to receive a control voltage, is characterized in that the common connection of the emitters is also connected through a by-pass resistance to a bias voltage source, the circuit parameters being such that flow of bias current will result in a small current being diverted through the by-pass resistance instead of flowing through said transistors, this small current approximating in value to the value of any residual bias current when the current source is switched off, and having a value which is negligible relative to the value of the bias current when the current source is switched on.

The operation of a differential amplifier according to the invention is not significantly affected when the bias current is large. However, for small values of bias current, when it is intended that the bias current should be zero, the bias current is mostly diverted into the by-pass resistance so that the current into the transistors is approximately zero, and the output current is therefore also approximately zero. Thus, when the differential amplifier is intended to be 'OFF', suppression of the control of the output current by the control voltage is improved.

BRIEF DESCRIPTION OF THE DRAWINGS

In further considering the nature of the invention, reference will now be made by way of example to the accompanying drawings, of which.

DESCRIPTION OF THE PREFERRED EMBODIMENT

Figure 2:
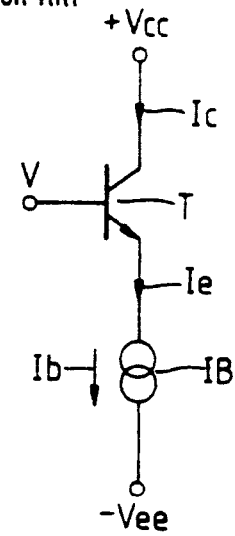
FIG. 2 shows a simple transistor circuit.

Referring to the drawings, in the simple transistor circuit shown in FIG. 2, a transistor T has its collector connected to a positive supply terminal +Vcc and its emitter connected through a current source IB to a negative supply terminal −Vee. The base of the transistor T is connected to an input signal terminal V. The base-emitter voltage $V_{BE}$ of the transistor T is related to the current through the transistor by the expression $V_{BE} = V_T \ln(Ic/Is)$, where $V_T$ is the voltage equivalent of temperature (68£F, 20£C.) and is at room temperature approximately 26 mV, Is is the saturation current of the particular transistor, for which a typical value is $10 \times 10^{-18}$A, and Ic is the collector current of the transistor. Therefore, for a wide variation in the transistor collector current Ic, and therefore also in the transistor emitter current Ie, as will occur in response to changes in bias current Ib, the change in the base-emitter voltage $V_{BE}$ is small. For example, for a (large) collector current Ic=100 A, $V_{BE}$ ≃ 0.78 volts, and for a (small) collector current Ic=100 nA, $V_{BE}$ ≃ 0.6 volts. The emitter current Ie will always equal the current Ib through the current source IB and will be substantially the same as the collector current Ic.

Figure 3:
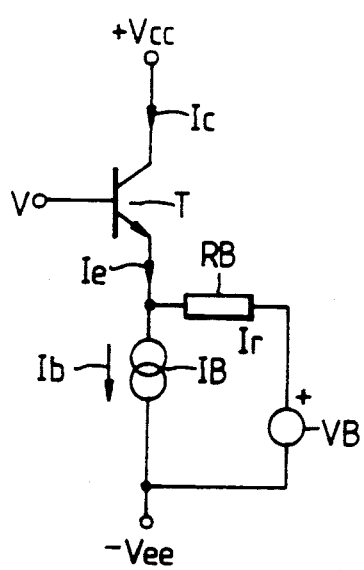
FIG. 3 shows the circuit of FIG. 2 modified to illustrate the principle on which the invention is based.

In FIG. 3, which illustrates the principle of the invention, there is provided a by-pass circuit comprising a resistor RB which is connected between the emitter of the transistor T and a bias voltage source VB which approximates to the voltage applied at the base of the transistor T. Assuming that the current source IB supplies a current Ib=100 A when it is switched-on, and further assuming that the resistor RB=1M, then for $V_{BE}$_0.78 V, the voltage across the resistor RB will be _0.7 V and the resistor RB will pass a current Ir of 0.78 V/1M=0.78 A. The remainder of the current from the current source IB, that is 99.22 A, will form the emitter current Ie. Therefore, when the current Ib is large the circuit operation is not significantly affected because the current Ir is small relative to the emitter current Ie. If when the current source IB is supposed to be switched-off, it in fact passes a leakage current of 100 nA, then in this instance there will be virtually no emitter current Ie and the current flow will be substantially only the current Ir through the resistor RB. The voltage across the resistor RB will now be only 100 nA×1M=0.1 V, so that the base-emitter voltage $V_{BE}$ will also only be_0.1 V instead of_0.78 V as would be the case without the by-pass circuit. Therefore, the base-emitter junction of the transistor T does not become significantly forward biassed and there will be negligible collector current Ic (approximately $470 \times 10^{-18}$ A).

Figure 1:
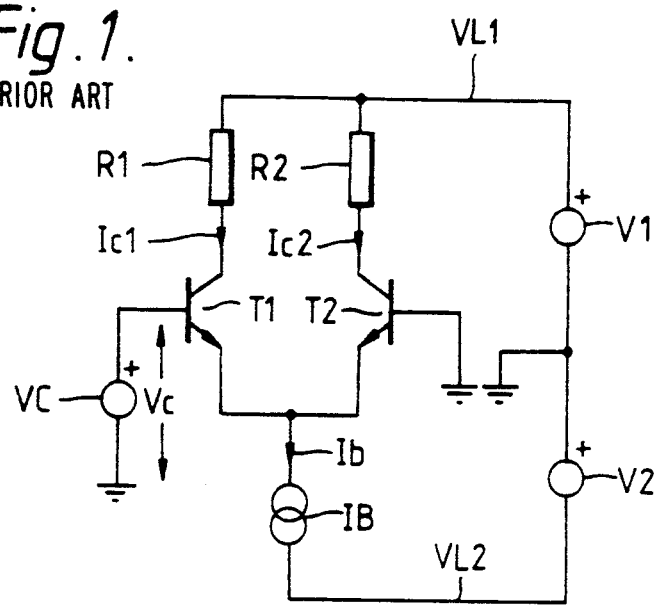
FIG. 1 shows, as aforesaid, a basic circuit of a differential amplifier.
Figure 4:
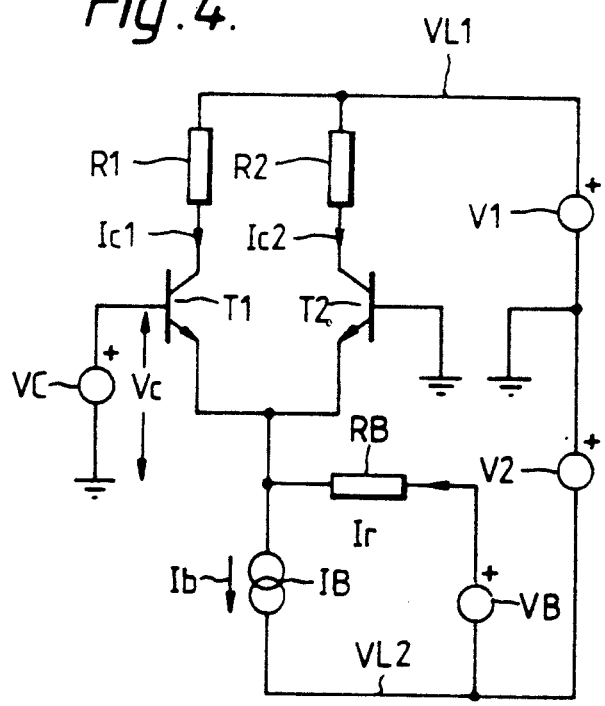
FIG. 4 shows a differential amplifier according to the invention.

FIG. 4 shows the differential amplifier of FIG. 1 provided with a by-pass circuit comprising the resistor RB and the voltage source VB. In the presence of the applied input voltage Vc, this amplifier can be turned 'ON' and 'OFF' by switching the current source IB on and off, with a high degree of suppression in the 'OFF' condition.

Figure 5:
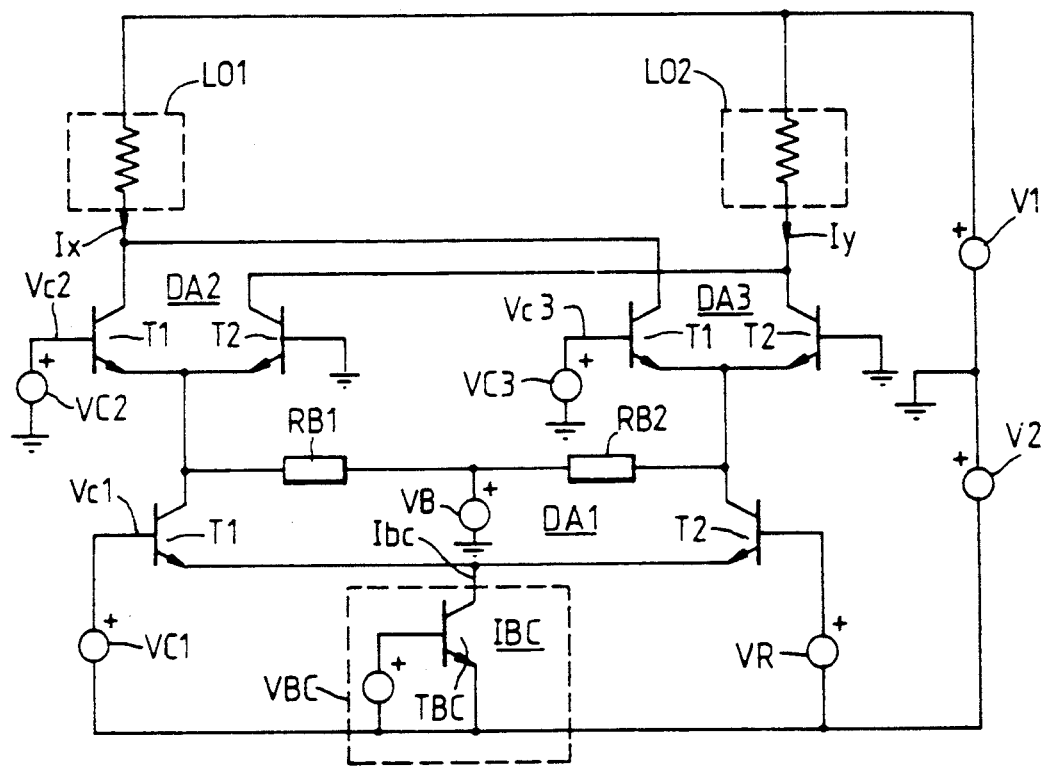
FIG. 5 shows a high suppression switch using differential amplifiers according to the invention.

The high suppression switch shown in FIG. 5 comprises three differential amplifiers DA1, DA2 and DA3. A constant current source IBC supplies a current Ibc and the amplifier DA1 can be switched to supply the current Ibc to either one of the other two amplifiers DA2 and DA3. The current source IBC comprises a transistor TBC which is maintained conductive by a voltage supply VBC. The switching of the amplifier DA1 is controlled by a control voltage source VC1 which supplies a control voltage Vc1. Transistor T2 of the amplifier DA1 is normally held conductive by a reference voltage source VR to pass the current Ibc to the amplifier DA3. Transistor T1 of the amplifier DA1 can be made conductive instead by control voltage Vc1 from the source VC1 to divert the current Ibc to the amplifier DA2. Resistor RB1 and the bias voltage supply VB provide a by-pass circuit for the amplifier DA2, and resistor RB2 and the bias voltage supply VB provide a by-pass circuit for the amplifier DA3. These by-pass circuits ensure in accordance with the invention that the respective amplifier DA2 or DA3 is fully switched off when the current Ibc is diverted from it. Thus, when the amplifier DA2 is 'ON' and amplifier DA3 'OFF', currents Ix and Iy through load circuits LO1 and LO2 are controlled by control voltage Vc2 from the control voltage source VC2 at the base of transistor T1 of amplifier DA2. When the amplifier DA3 is 'ON' and amplifier DA2 'OFF', the currents Ix and Iy through the load circuits LO1 and LO2 are controlled by control voltage Vc3 from the control voltage source VC3 at the base of transistor T1 of amplifier DA3. The circuit of FIG. 5 can be extended by providing further differential amplifiers such as DA2 and DA3 which are controlled by respective transistors such as T1 and T2 of DA1.

Figure 6:
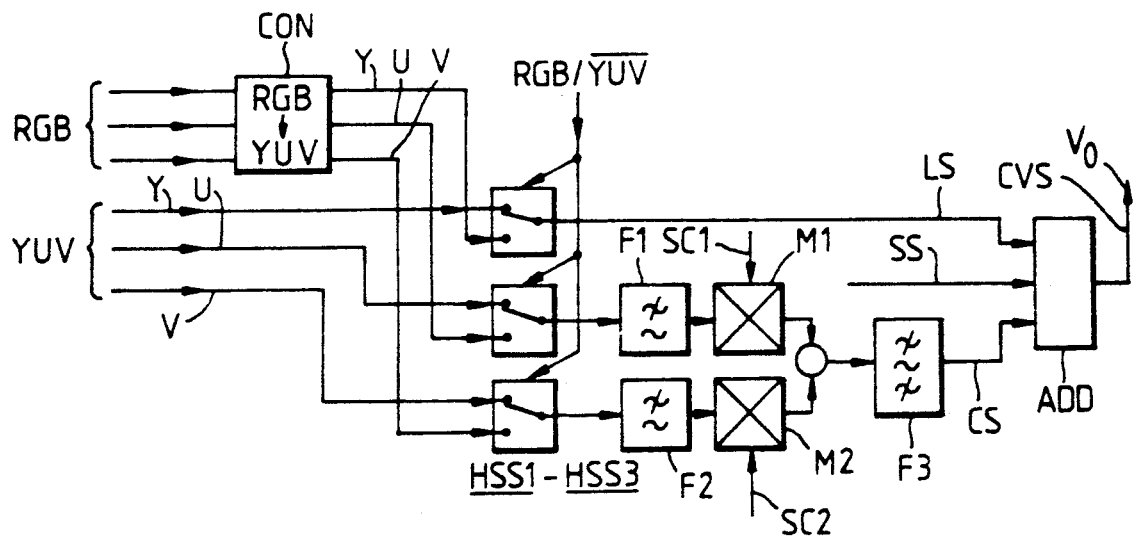
FIG. 6 illustrates an application for the switch of FIG. 5.

FIG. 6 shows diagrammatically a video signal switching arrangement in which three high suppression switches of the form shown in FIG. 5 can be used. This arrangement has RGB video signal inputs and YUV video signal inputs. A converter CON converts received RGB signals into equivalent YUV signals. Either YUV signals applied at the YUV input or the equivalent YUV signals from the converter CON can be selected to form a composite video signal CVS at a video signal output VO of the arrangement. The arrangement includes three high suppression switches HSS1 to HSS3 to which the corresponding Y, U and V component signals are applied, respectively. These pairs of component signals form the control voltages Vc2 and Vc3 for the respective switch. An RGB/YUV control input supplies a control signal which forms the control voltage VBc for all three switches. Thus, either set of YUV signals can be selected, with a high degree of suppression of the unwanted set. The selected component signals U and V are filtered in respective filters F1 and F2, and are modulated in respective modulators M1 and M2 with respective sub-carrier signals SC1 and SC2, and the modulation products are combined and passed through a filter F3 to produce a resultant chroma signal CS. The Y component signal forms a luminance signal LS, and the signal LS and CS are combined with synchronising signals SS in an adder ADD to form the composite video signal CVS.

From reading the present disclosure, other modifications will be apparent to persons skilled in the art. Such modifications may involve other features which are already known per se and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A differential amplifier comprising two transistors having their collectors connected through respective loads to one supply line, their emitters connected together and to a controllable constant current source which supplies a bias current and which is connected between the common connection of the emitters and return supply line, and their bases connected to receive a control voltage, which differential amplifier is characterized in that the common connection of the emitters is also connected through a by-pass resistance to a bias voltage source, the circuit parameters being such that flow of bias current will result in a small current being diverted through the by-pass resistance instead of flowing through said transistors, this small current approximating in value to the value of any residual bias current when the current source is switched off, and having a value which is negligible relative to the value of the bias current when the current source is switched on.

2. A high suppression switch characterized by comprising two or more differential amplifiers as claimed in claim 1, but with the collectors of their corresponding transistors connected to common loads, and with a common constant current source which is connected to the common connection of the emitters of two or more further transistors which have their collectors connected, respectively, to the common connection of the transistor emitters of said two or more differential amplifiers, said constant current source being switchable by control of said further transistors to supply current to one of said two or more differential amplifiers, whereby one of said two or more differential amplifiers can be 'ON' to control current through the loads while the other(s) is/are 'OFF'.

3. A video signal switching arrangement characterized by comprising RGB video signal inputs, converter means to convert received RGB signals into equivalent YUV signals, YUV video signal inputs for receiving YUV signals, and three high suppression switches, each as claimed in claim 2 and each having said two differential amplifiers thereof controlled by a respective corresponding component signal of the two sets of YUV signals, and all switches having their respective constant current sources switchably controlled in common by a select signal, whereby to select one or the other of the two sets of YUV signals.

* * * * *

UNITED STATES PATENT AND TRADEMARK OFFICE
CERTIFICATE OF CORRECTION

PATENT NO. : 5,151,780

DATED : September 29, 1992

INVENTOR(S) : David M. Chapman

It is certified that error appears in the above-identified patent and that said Letters Patent is hereby corrected as shown below:

On the title page, Item [22] date of filing of application should be changed from "Mar. 9, 1999" to -- Mar. 9, 1990 --.

Signed and Sealed this

Fifth Day of October, 1993

Attest:

BRUCE LEHMAN

Attesting Officer    Commissioner of Patents and Trademarks